United States Patent [19]
Hirano

[11] Patent Number: 5,953,252
[45] Date of Patent: Sep. 14, 1999

[54] HIGH READ SPEED MULTIVALUED READ ONLY MEMORY DEVICE

[75] Inventor: Masanori Hirano, Kanagawa, Japan

[73] Assignee: NEC Corporation, Tokyo, Japan

[21] Appl. No.: 09/031,105

[22] Filed: Feb. 26, 1998

[30] Foreign Application Priority Data

Feb. 27, 1997 [JP] Japan .................................. 9-044128

[51] Int. Cl.$^6$ ............................ G11C 16/06; G11C 17/00
[52] U.S. Cl. ......................................... 365/185.2; 365/94
[58] Field of Search .......................... 365/185.2, 185.21, 365/210, 185.23, 185.25, 94

[56] References Cited

U.S. PATENT DOCUMENTS

| | | | |
|---|---|---|---|
| 4,648,074 | 3/1987 | Pollachek | 365/184 |
| 5,297,084 | 3/1994 | Ban | 365/189.09 |
| 5,526,306 | 6/1996 | Hikawa et al. | 365/182 |
| 5,680,343 | 10/1997 | Kamaya | 365/185.03 |
| 5,721,701 | 2/1998 | Ikebe et al. | 365/185.03 |

FOREIGN PATENT DOCUMENTS

| | | |
|---|---|---|
| 61-117796 | 6/1986 | Japan . |
| 8-124389 | 5/1996 | Japan .............................. G11C 16/04 |
| 8-297982 | 11/1996 | Japan . |

*Primary Examiner*—David Nelms
*Assistant Examiner*—Anh Phung
*Attorney, Agent, or Firm*—Hayes, Soloway, Hennessey, Grossman & Hage, PC

[57] ABSTRACT

In a multivalued read only memory device, a plurality of memory cells each for storing N (N=3, 4, . . . ) information states corresponding to N threshold voltages are connected to word lines, and a plurality of reference memory cells for storing said N information states are connected to a reference word line. A word line selecting circuit selects one of the word lines and selects the reference word line, so that the voltages at the selected word line and at the reference word line are gradually increased. A latch timing generating circuit generates latch timing signals in accordance with output signals of the reference memory cells, and a latch circuit latches an output signal of the memory cells in accordance with the latch timing signals. An encoder circuit generates output data in accordance with output signals of the latch circuit.

15 Claims, 18 Drawing Sheets

| VT | L0 | L1 | L2 | D0 | D1 |
|----|----|----|----|----|----|
| VT0 | 1 | 1 | 1 | 0 | 0 |
| VT1 | 0 | 1 | 1 | 0 | 1 |
| VT2 | 0 | 0 | 1 | 1 | 0 |
| VT3 | 0 | 0 | 0 | 1 | 1 |

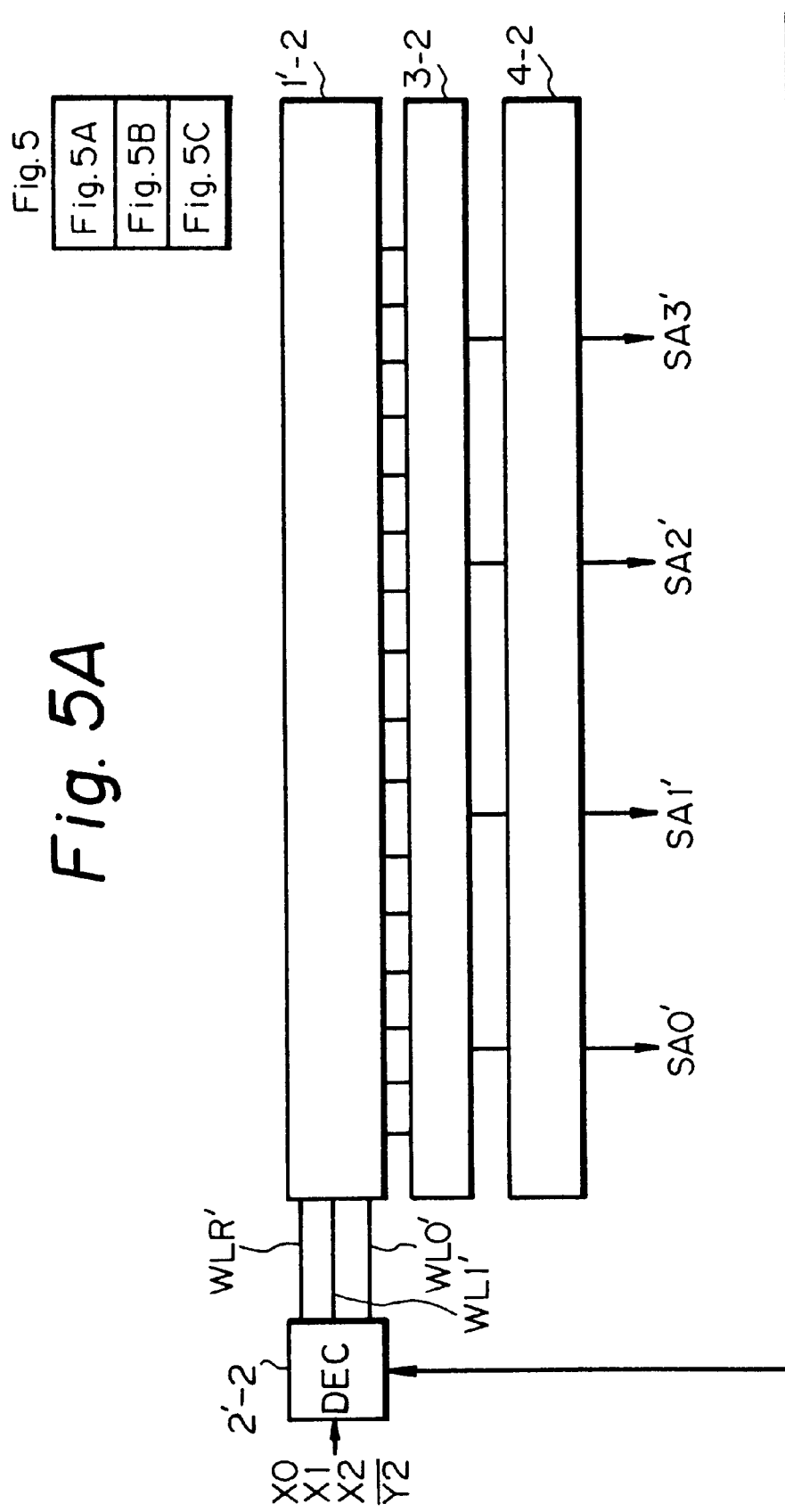

| VT | L0 | L1 | L2 | D0 | D1 |
|---|---|---|---|---|---|
| VT0 | 1 | 1 | 1 | 1 | 1 |
| VT1 | 0 | 1 | 1 | 0 | 1 |
| VT2 | 0 | 0 | 1 | 0 | 0 |
| VT3 | 0 | 0 | 0 | 1 | 0 |

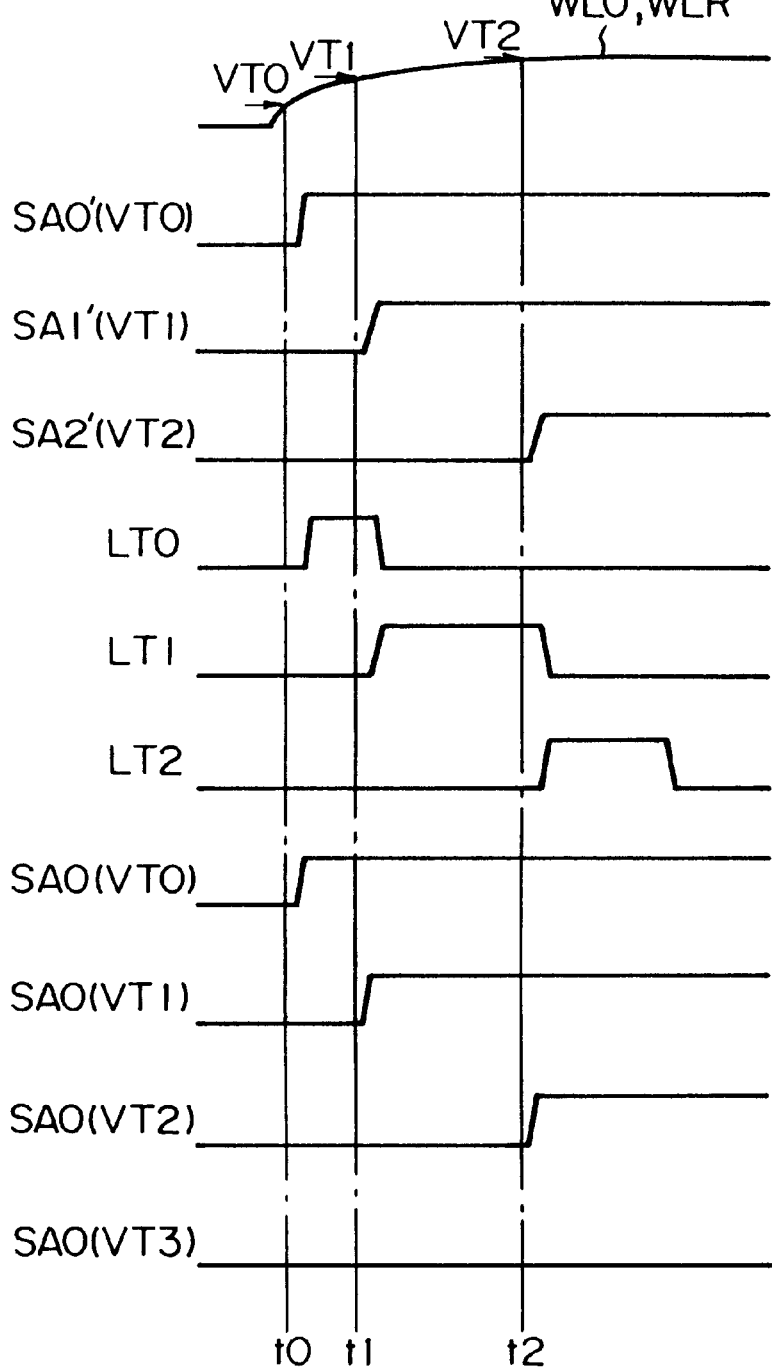

Fig. 12

| VT  | L0 | L1 | L2 | D0 | D1 |
|-----|----|----|----|----|----|
| VT0 | 1  | 1  | 1  | 1  | 1  |
| VT1 | 0  | 1  | 1  | 0  | 1  |
| VT2 | 0  | 0  | 1  | 0  | 0  |
| VT3 | 0  | 0  | 0  | 1  | 0  |

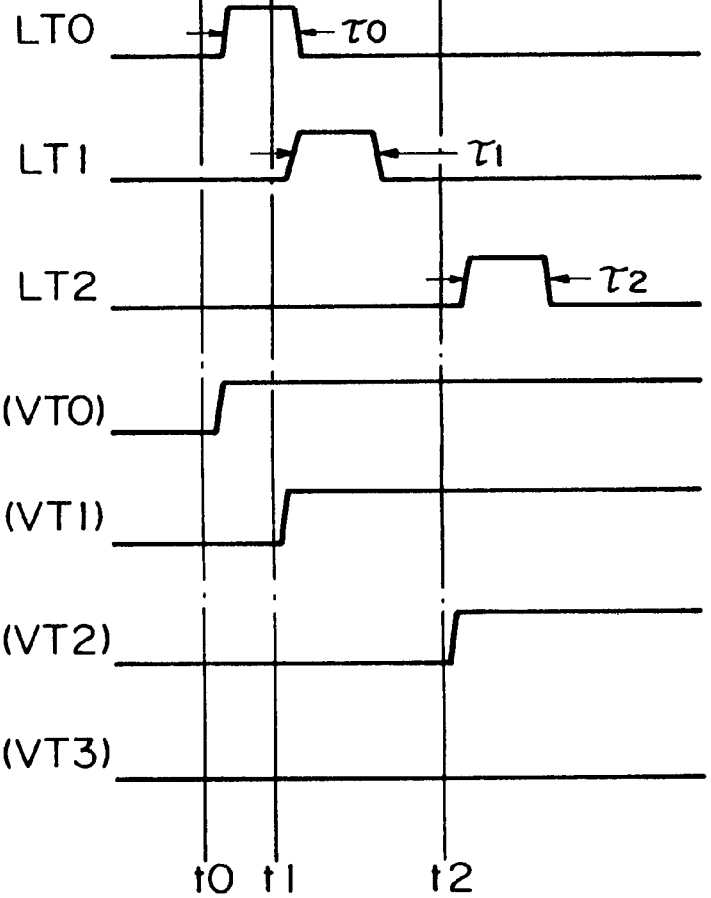

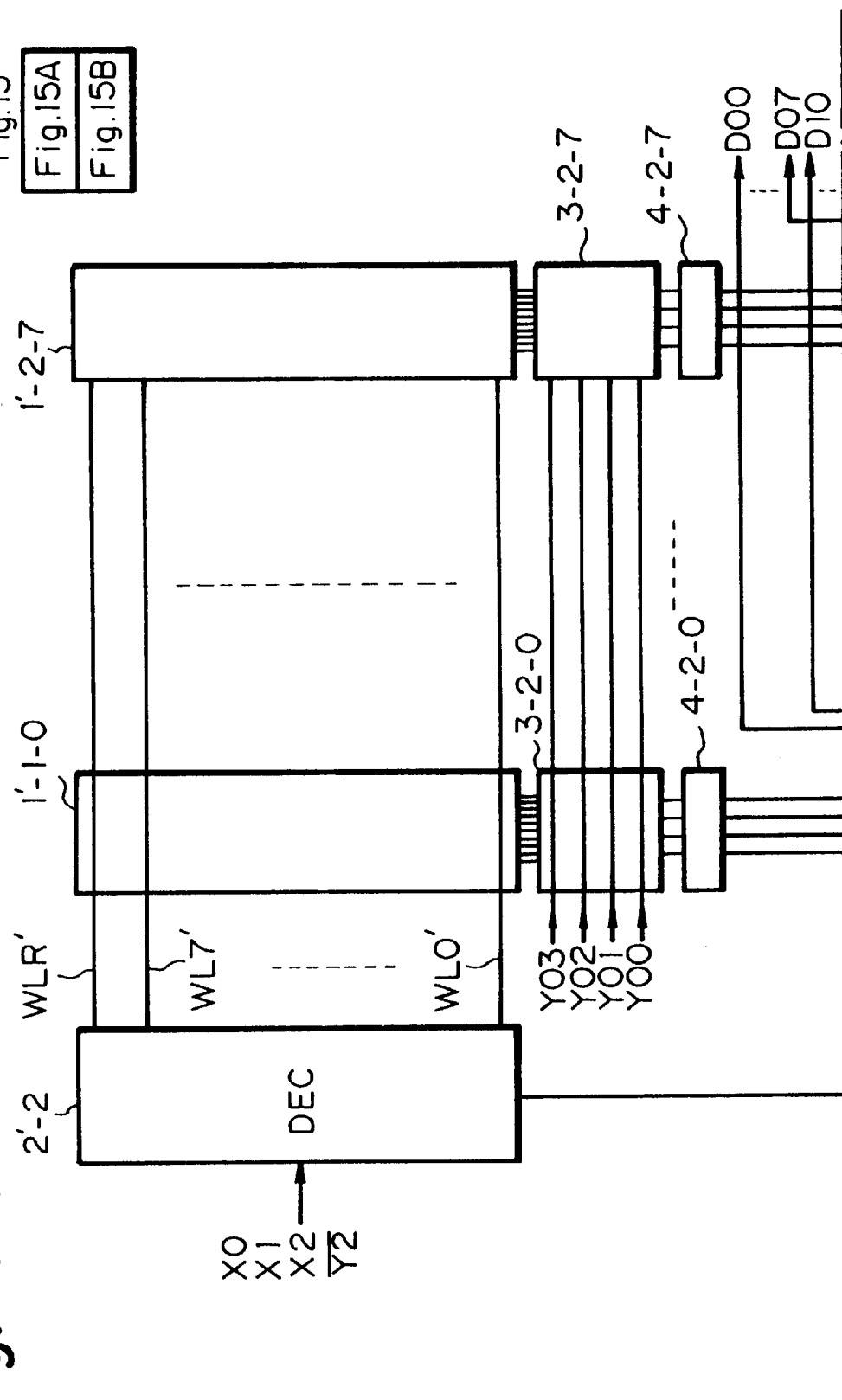

HIGH READ SPEED MULTIVALUED READ ONLY MEMORY DEVICE

BACKGROUND OF THE INVENTION

1. Field of the Invention

The present invention relates to a multivalued read only memory (ROM) device having memory cells each capable of storing N (N=3, 4, . . . ) information, and more particularly, to a multivalued ROM device capable of carrying out a high read speed operation.

2. Description of the Related Art

In a ROM device, if N information is stored in each memory cell, the storage capacity becomes larger than a conventional ROM device. In order to meet this requirement, multivalued ROM devices having memory cells each storing N information have recently been developed.

In a prior art four-valued ROM device including memory cells each storing two-bit information (four pieces of information), in order to carry out a read operation, when an address is given to the device, three kinds of threshold voltages are applied to a selected word line. Therefore, three time periods for generating the three kinds of threshold voltages are required for one read access, thus decreasing a read operation speed. Also, the sense amplifiers of the device may be erroneously operated by a small noise. Further, the integration of the device is deteriorated. This will be explained later in detail.

Note that it is possible to provide a plurality of comparators for comparing a read voltage from a selected memory with a plurality of preset levels at one time, which increases a read operation speed (see JP-A-61-117796). However, this requires enhancing the sensitivity of the sense amplifiers, since the sense amplifiers have to amplify a small difference in potential. Also, the comparators and voltage generating circuits for the preset levels deteriorates the integration.

SUMMARY OF THE INVENTION

It is an object of the present invention to provide a multivalued ROM device such as a four-valued ROM device capable of carrying out a high read speed operation without deteriorating the integration.

According to the present invention, in a multivalued read only memory device, a plurality of memory cells each for storing N (N=3, 4, . . . ) information states corresponding to N threshold voltages are connected to word lines, and a plurality of reference memory cells for storing said N information states is connected to a reference word line. A word line selecting circuit selects one of the word lines and selects the reference word line, so that the voltages at the selected word line and at said reference word line are gradually increased. A latch timing generating circuit generates latch timing signals in accordance with output signals of the reference memory cells, and a latch circuit latches an output signal of the memory cells in accordance with the latch timing signals. An encoder circuit, generates output data in accordance with output signals of the latch circuit.

BRIEF DESCRIPTION OF THE DRAWINGS

The present invention will be more clearly understood from the description as set forth below, as compared with the prior art, with reference to the accompanying drawings wherein:

FIGS. 5A, 5B and 5C block circuit diagrams illustrating a first embodiment of the four-valued ROM device according to the present invention;

FIGS. 11A through 11L are timing diagrams showing the read operation of the device of FIG. 5;

FIG. 12 is a table showing the relationship between the threshold voltages and the output data of the device of FIG. 5;

FIGS. 14A through 14L are timing diagrams showing the operation of the device of FIG. 13;

FIGS. 15A and 15B are block circuit diagrams illustrating a second embodiment of the four-valued ROM device according to the present invention.

DESCRIPTION OF THE PREFERRED EMBODIMENTS

Before the description of the preferred embodiments, a prior art four-valued ROM device will be explained with reference to FIGS. 1, 2, 3A, 3B, 4A and 4B.

Figure 1A:
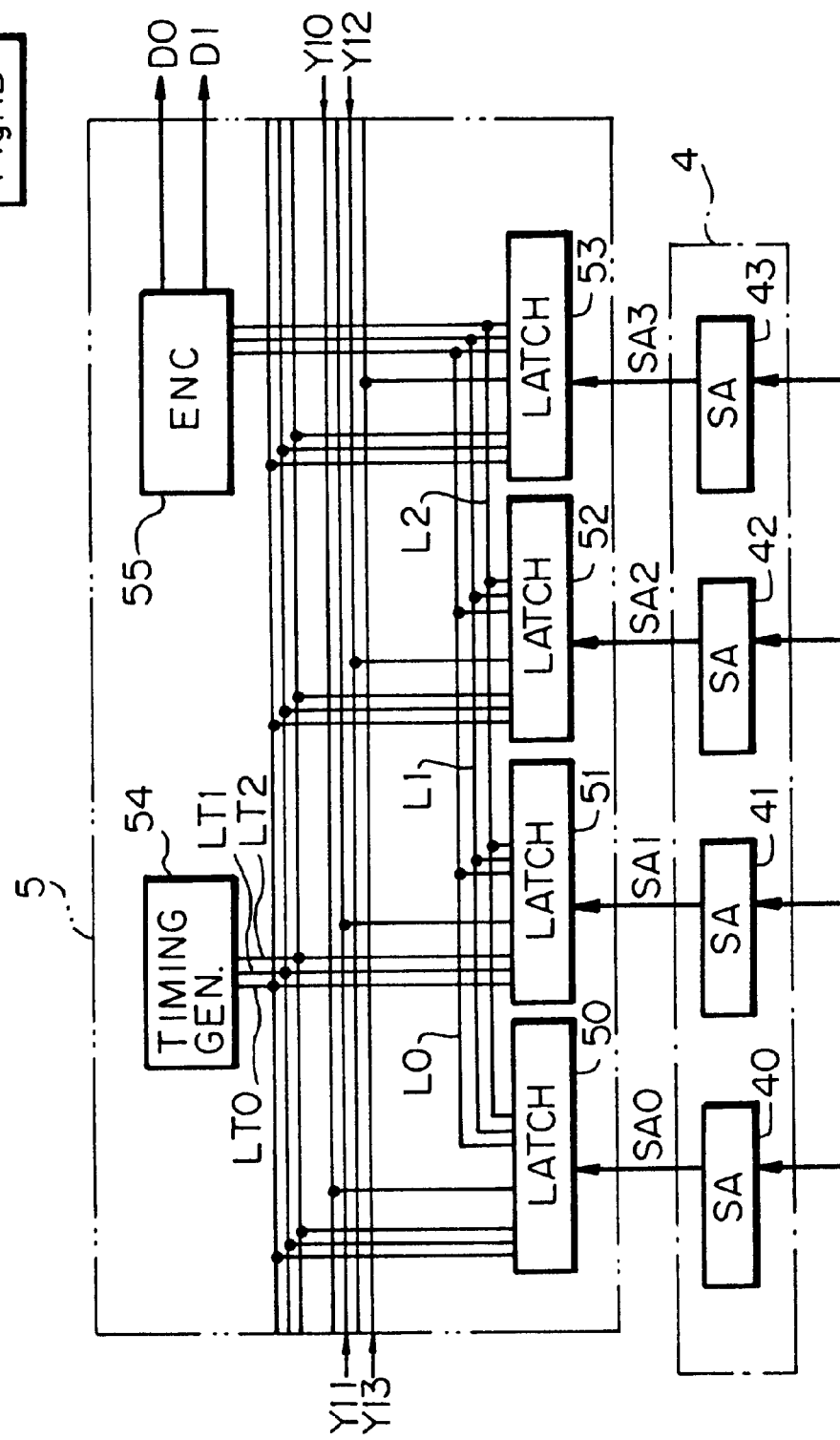
FIGS. 1A and 1B are block circuit diagrams illustrating a prior art four-valued ROM device.
Figure 1B:
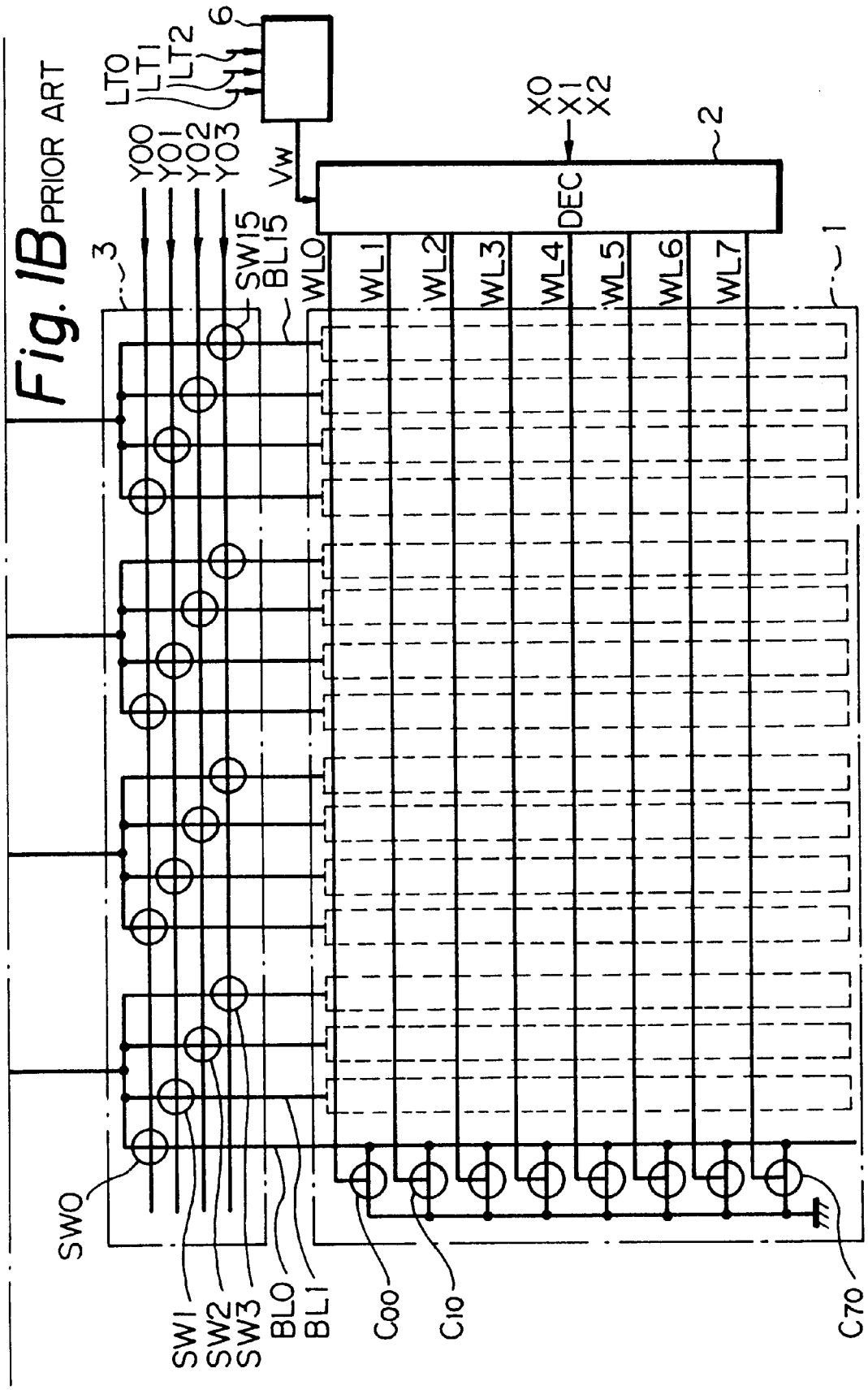

In FIG. 1, reference numeral 1 designates a memory cell array constructed by memory cells $C_{i,j}$ (i=0, 1, . . . , 7, j=0, 1, . . . , 15) which are located at intersections between word lines WL0, WL1, . . . , WL7 and bit lines $BL_0$, $BL_1$, . . . , $BL_{15}$. There are four kinds of threshold voltages VT0, VT1, VT2 and VT3 for the memory cells, and one of the threshold voltages is written into the memory cells in advance. That is, two bit information is written into each of the memory cells.

One of the word lines WL0, WL1, . . . , WL7 is selected by a row decoder 2 for receiving X address signals X0, X1 and X2. Note that a voltage $V_W$ is applied to the row decoder 2.

The bit lines BL0, BL1, . . . , BL15 are connected to a Y selector circuit 3 which is also connected to sense amplifiers 40, 41, 42 and 43 of a sense amplifier circuit 4. That is, all four bit lines such as BL0, BL1, BL2 and BL3 are connected via four switching transistors such as SW0, SW1, SW2 and SW3 to one sense amplifier such as 40. In this case, in the Y selector circuit 3, the switching transistors SW0, . . . , SW12 are controlled by a Y switch signal Y00, the switching transistors SW1, . . . , SW13 are controlled by a Y switch signal Y01, the switching transistors SW2, . . . , SW14 are controlled by a Y switch signal Y02, and the switching transistors SW3, . . . , SW15 are controlled by a Y switch signal Y03.

Output signals SA0, SA1, SA2 and SA3 of the sense amplifiers 40, 41, 42 and 43 are supplied to a determination circuit 5.

The determination circuit 5 is constructed by four latch circuits 50, 51, 52 and 53, a latch timing generating circuit 54, and an encoder circuit 55. The latch circuits 50, 51, 52 and 53 are connected to the sense amplifiers 40, 41, 42 and 43, respectively.

One of the latch circuits 50, 51, 52 and 53 is selected by Y switch signals Y10, Y11, Y12 and Y13. For example, when the voltage of the Y switch signal Y10 is high, the latch circuit 50 is activated. In addition, the latch circuits 50, 51, 52 and 53 are controlled by three latch timing signals LT0, LT1 and LT2 generated from the latch timing generating circuit 54.

Note that reference numeral 6 designates a voltage generating circuit for receiving the latch timing signals LT0, LT1 and LT2 and generating the voltage $V_W$.

Figure 2:
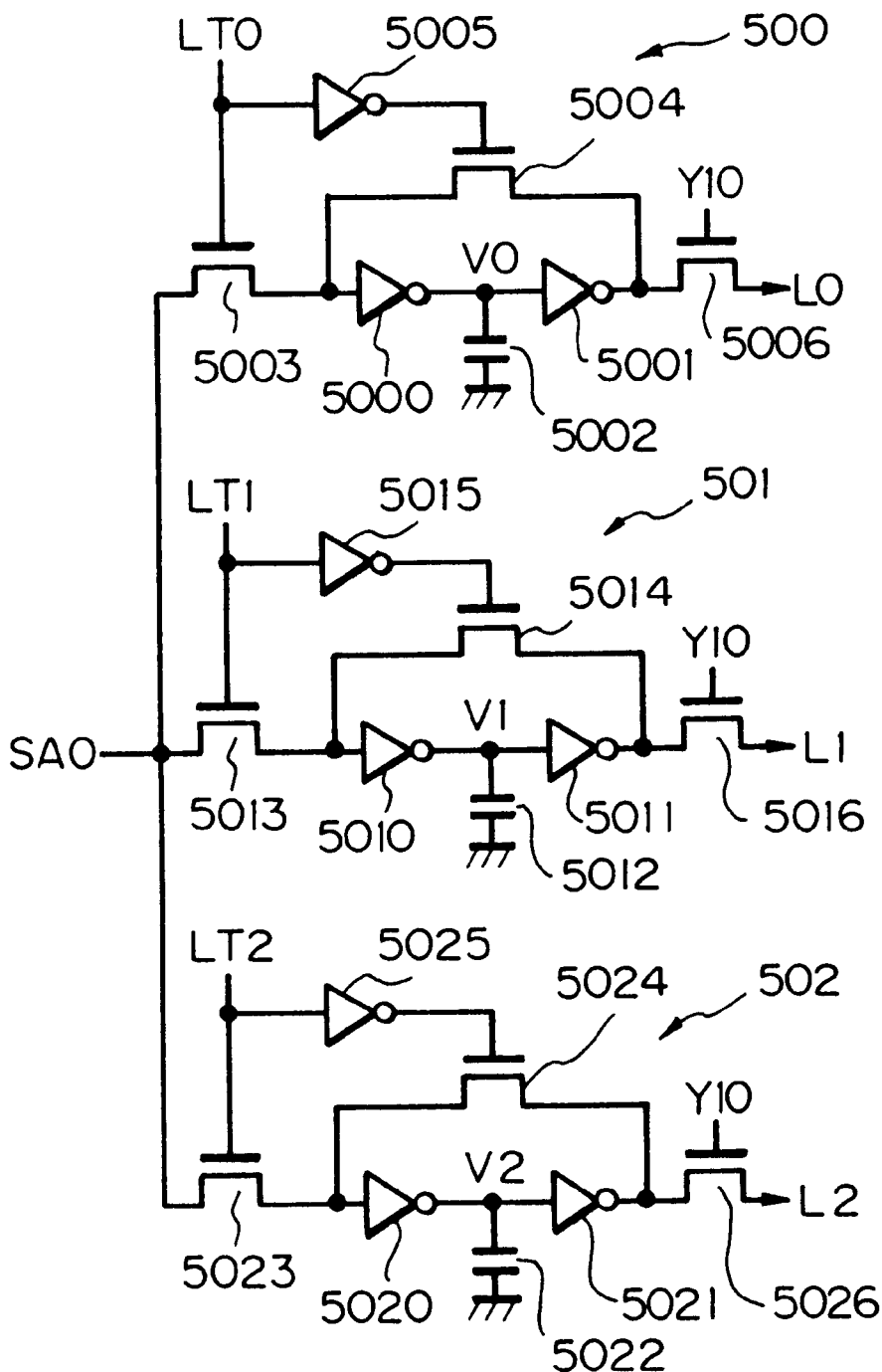
FIG. 2 is a detailed circuit diagram of the latch circuit of FIG. 1.

FIG. 2 is a detailed circuit diagram of the latch circuit 50 of FIG. 1. Note that the latch circuits 51, 52 and 53 have the same configuration as the latch circuit 50. As illustrated in FIG. 2, the latch circuit 50 is constructed by three latch elements 500, 501 and 502 activated by the latch timing signals LT1, LT1 and LT2, respectively. For example, the latch element 500 is constructed by two inverters 5000 and 5001 and a capacitor 5002 therebetween, switching transistors 5003 and 5004, an inverter 5005, and a switching transistor 5006 controlled by the Y switch signal Y10. In this case, when the latch timing signal LT0 is high, the transistors 5003 and 5004 are turned ON and OFF, so that the output signal SA0 of the sense amplifier 40 is supplied via the switching transistor 5003 and the inverter 5000 to the capacitor 5002. Thereafter, when the latch timing signal LT0 becomes low, a latch operation is performed upon the inverters 5000 and 5001 associated with the capacitor 5002, so that a voltage V0 corresponding to the output signal SA0 of the sense amplifier 40 is latched at the capacitor 5002. The voltage V0 is transmitted via the switching transistor 5006 as a signal L0 to the encoder circuit 55. Similarly, a voltage V1 corresponding to the output signal SA0 of the sense amplifier 40 is latched by the latch element 501 and is transmitted via a switching transistor 5016 as a signal L1 to the encoder circuit 55. Also, a voltage V2 corresponding to the output signal SA0 of the sense amplifier 40 is latched by the latch element 502 and is transmitted via a switching transistor 5026 as a signal L2 to the encoder circuit 55.

Figures 3A, 3B:
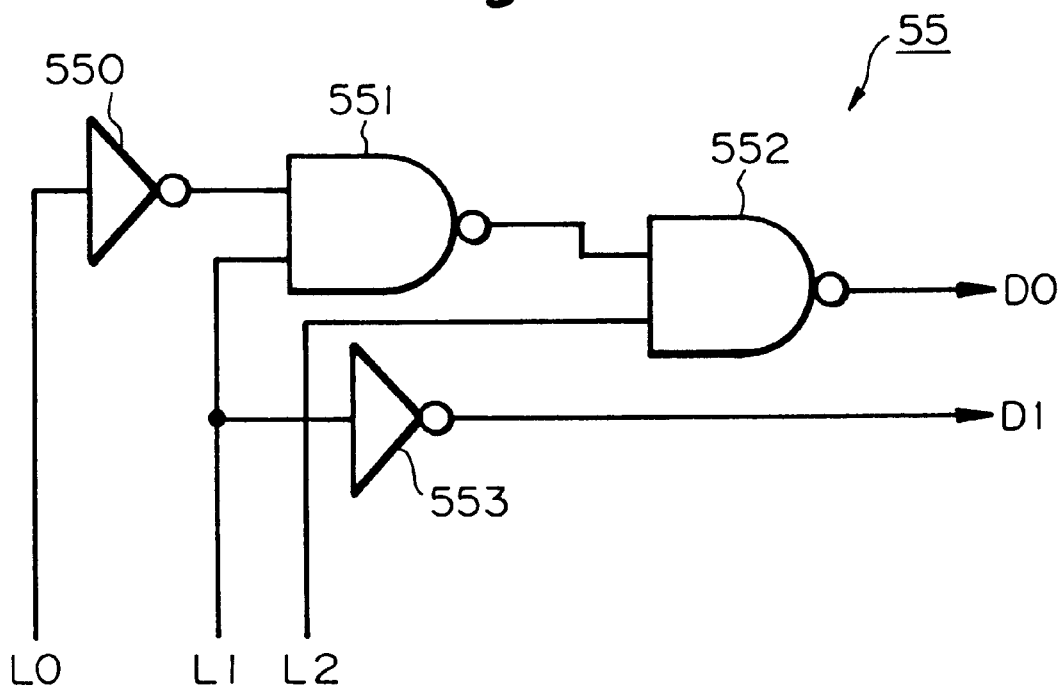
FIG. 3A is a detailed circuit diagram of the encoder circuit of FIG. 1.
FIG. 3B is a table showing the input and output relationship of the encoder circuit of FIG. 3A.

In FIG. 3A, which is a detailed circuit diagram of the encoder circuit 55 of FIG. 1, the encoder circuit 55 is constructed by an inverter 550 for receiving the signal L0, a NAND circuit 551 for receiving an output signal of the inverter 550 and the signal L1, a NAND circuit 552 for receiving an output signal of the NAND circuit 551 and the signal L2, and an inverter 553 for receiving the signal L1. The input and output relationship of the encoder circuit 55 of FIG. 3A is shown in FIG. 3B.

Figure 4A:
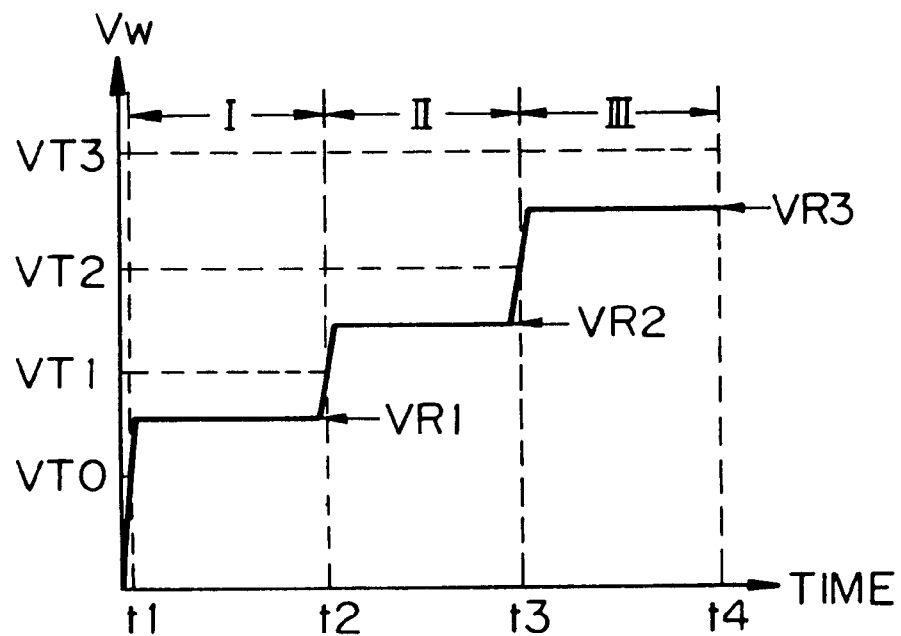
FIGS. 4A and 4B are timing diagrams showing the read operation of the device of FIG. 1.
Figure 4B:
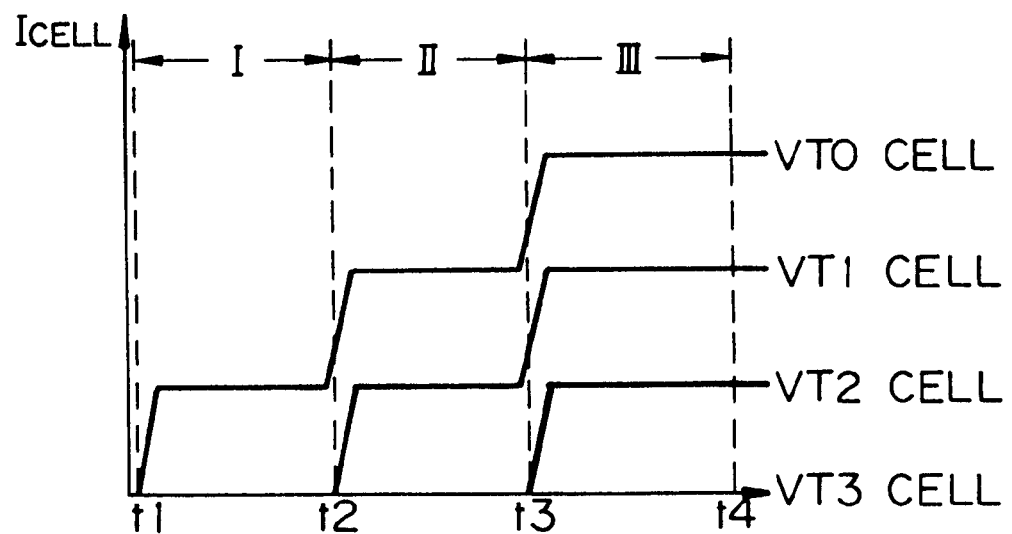

The operation of the device of FIG. 1 is explained next with reference to FIGS. 4A and 4B which show the characteristics of the voltage $V_W$ and the cell current of a selected memory cell. Note that the voltage $V_W$ at the selected word line is changed by the voltage generating circuit 6 in accordance with the latch timing signals LT0, LT1 and LT2. That is, for a time period I from t1 to t2, the latch timing signal LT0 is caused to be high and, thereafter, is caused to be low, and as a result, the voltage $V_W$ is caused to be a reference voltage VR1 (VT0<VR1<VT1). Also, for a time period II from t2 to t3, the latch timing signal LT1 is caused to be high and, thereafter, is caused to be low, and as a result, the voltage $V_W$ is caused to be a reference voltage VR2 (VT1<VR1<VT2). Further, for a time period III from t3 to t4, the latch timing signal LT2 is caused to be high and, thereafter, is caused to be low, and as a result, the voltage $V_W$ is caused to be a reference voltage VR3 (VT2<VR3<VT3). In this case, if a selected memory cell has a threshold of VT0, a cell current $I_{CELL}$ flows therethrough for the time periods I, II and III. Also, if a selected memory cell has a threshold of VT1, a cell current $I_{CELL}$ flows therethrough for the time periods II and III. Further, if a selected memory cell has a threshold of VT2, a cell current $I_{CELL}$ flows therethrough only for the time period III. Moreover, if a selected memory cell has a threshold of VT3, no cell current $I_{CELL}$ flows therethrough. As a result, the ON- and OFF-states of the selected memory cell for the three time periods I, II and III are latched in the three latch elements of one of the latch circuit 50, 51, 52 and 53, and then, the latch signals L0, L1 and L2 of the three latch elements are supplied to the encoder circuit 55. Thus, the device of FIG. 1 can store twice as much information as conventional ROM devices.

In the prior art device of FIG. 1, however, since it takes three time periods I, II and III to obtain the data D0 and D1, a read time period is long. For example, if it takes about 200 ns for the voltage $V_W$ to stabilize at each level VR1, VR2 or VR3, a read time period is about 600 ns.

Also, in the device of FIG. 1, since the sense amplifiers 50, 51, 52 and 53 need to amplify a small difference, it is required to increase the sensitivity of the sense amplifiers 50, 51, 52 and 53. As a result, the device is subject to noise. For example, assume that a power supply voltage $V_{CC}$ is 5V, the threshold voltages VT0, VT1, VT2 and VT3 are 1.0V, 2.6V, 4.2V and 6.0V, respectively, and the reference voltages VR1, VR2 and VR3 are 1.8V, 3.4V and 5.0V, respectively. Then, a difference $\Delta V$ in potential between the gate voltage $V_G$ (=$V_W$) and the threshold voltage VT of the selected memory cell is 0.8V minimum, and at worst, this difference may be 0.6V in view of manufacturing fluctuations and noise. In this case, in a selected memory cell, if the drain voltage $V_D$ and the source voltage $V_S$ are 2.0V and 0.0V, respectively, then $$V_D > V_G - V_T$$

Therefore, the selected memory cell is operated in a saturated region, so that the ON current flowing through the selected memory cell is remarkably decreased. Note that since the ON current flowing through the selected memory cell is proportional to $(V_G - VT)^2$, the ON current where the difference $\Delta V$ is 0.6V is decreased by one-third of the ON current where the difference $\Delta V$ is 1V. Thus, if the sensitivity of the sense amplifiers 50, 51, 52 and 53 is enhanced to respond to such a small difference $\Delta V$, the sense amplifiers 50, 51, 52 and 53 may be erroneously operated by a small noise.

Further, in the device of FIG. 1, since the sense amplifiers 50, 51, 52 and 53 having a high sensitivity invite complexity and the voltage generating circuit 6 for the voltage $V_W$ is complex, the integration of the device of FIG. 1 is deteriorated.

Further, in the device of FIG. 1, since the encoder circuit 55 is complex, the integration of the device FIG. 1 is further deteriorated.

Figure 5B:
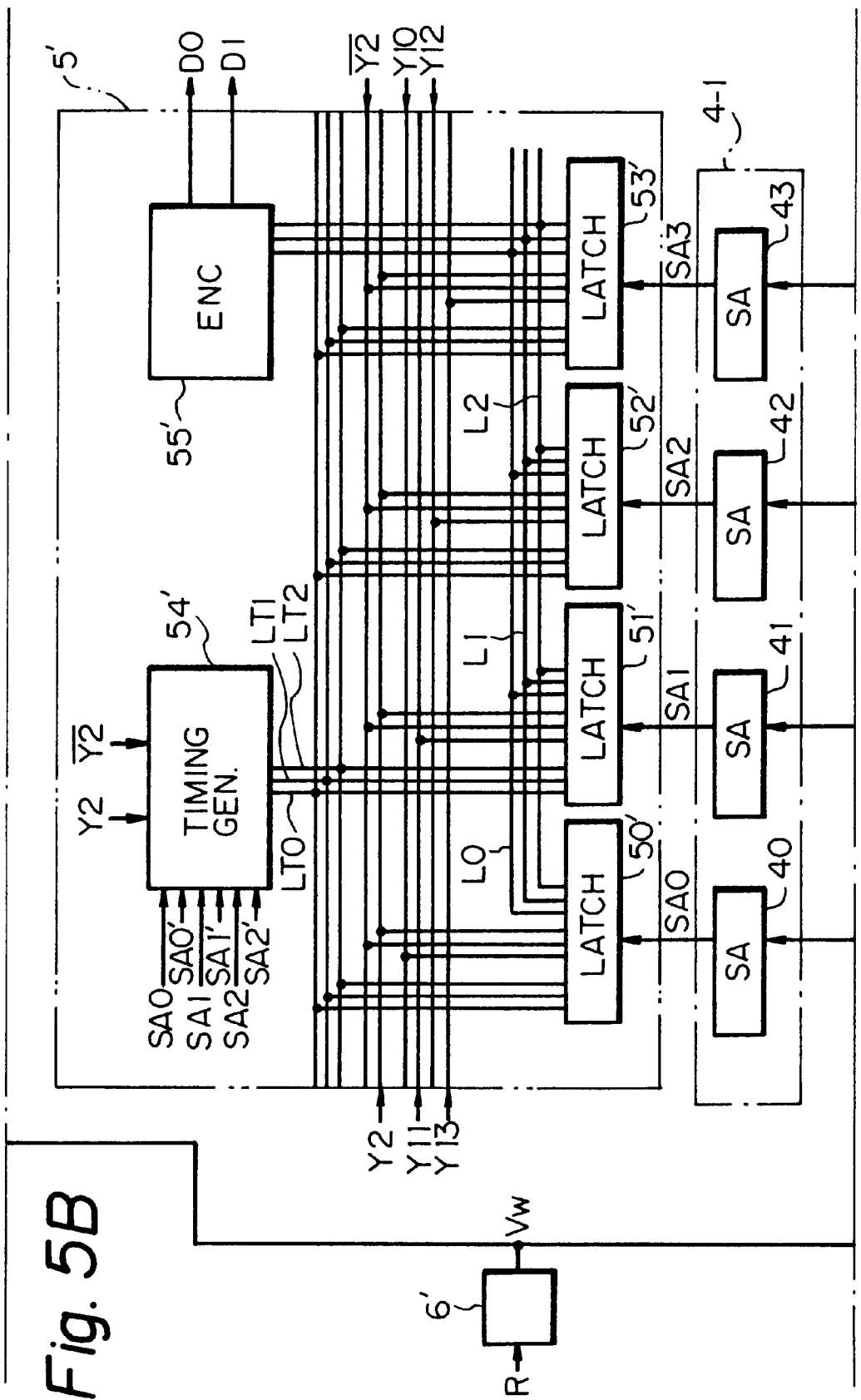
Figure 5C:
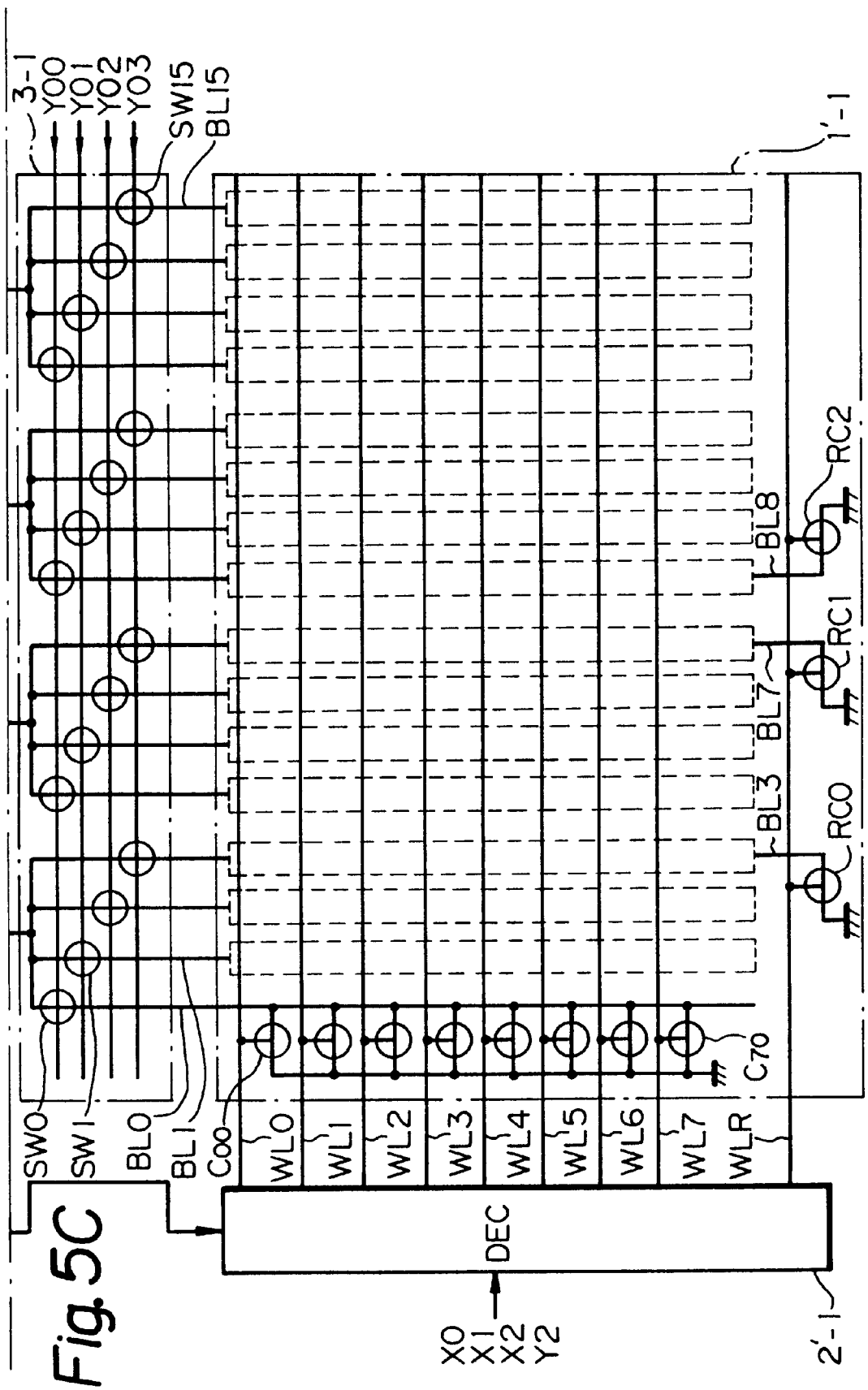

In FIG. 5, which illustrates a first embodiment of the present invention, two memory cell arrays 1'-1 and 1'-2 are provided instead of the memory cell array of FIG. 1; two row decoders 2'-1 and 2'-2 are provided instead of the row decoder 2 of FIG. 1; two Y selector circuits 3-1 and 3-2 are provided instead of the Y selector circuit 3 of FIG. 1; two sense amplifier circuits 4-1 and 4-2 are provided instead of the sense amplifier circuit 4 of FIG. 1; a determination circuit 5' provided instead of the determination circuit 5 of FIG. 1; and a voltage generating circuit 6' provided instead of the voltage generating circuit 6.

In the memory cell array 1'-1, a reference word line WLR is added to the word lines WL0, WL1, . . . , WL7 of FIG. 1. Also, a reference memory cell RC0 having the threshold voltage VT0 is connected between the reference word line WLR and a bit line such as BL3 belonging to the sense amplifier 40, a reference memory cell RC1 having the threshold voltage VT1 is connected between the reference word line WLR and a bit line such as BL7 belonging to the sense amplifier 41, and a reference memory cell RC2 having the threshold voltage VT2 is connected between the reference word line WLR and a bit line such as BL8 belonging to the sense amplifier 42. The memory cell array 1'-2 has a similar configuration to that of the memory cell array 1'-1.

The row decoder 2'-1 receives a Y switch signal Y2 as well as the X address signals X0, X1 and X2, and the row decoder 2'-2 receives a Y switch signal $\overline{Y2}$ as well as the X address signals X0, X1 and X2. As a result, when Y2="1", the row decoder 2'-1 selects one of word lines WL0, WL1, . . . , WL7, while the row decoder 2'-2 selects the reference word line WLR'. On the other hand, when $\overline{Y2}$="1", the row decoder 2'-2 selects one of word lines WL0', WL1', . . . , WL7', while the row decoder 2'-1 selects the reference word line WLR.

The Y selector circuits 3-1 and 3-2 have the same configuration as the Y selector circuit 3 of FIG. 1. Also, the sense amplifier circuits 4-1 and 4-2 have the same configuration as the sense amplifier circuit 4 of FIG. 1.

The determination circuit 5' constructed by latch circuits 50', 51', 52' and 53', corresponding to the latch circuit 50, 51, 52 and 53 of FIG. 1, an encoder circuit 55' to the encoder circuit 55 of FIG. 1, and a latch timing generating circuit 54' corresponding to the latch timing generating circuit 54 of FIG. 1.

Figure 6:
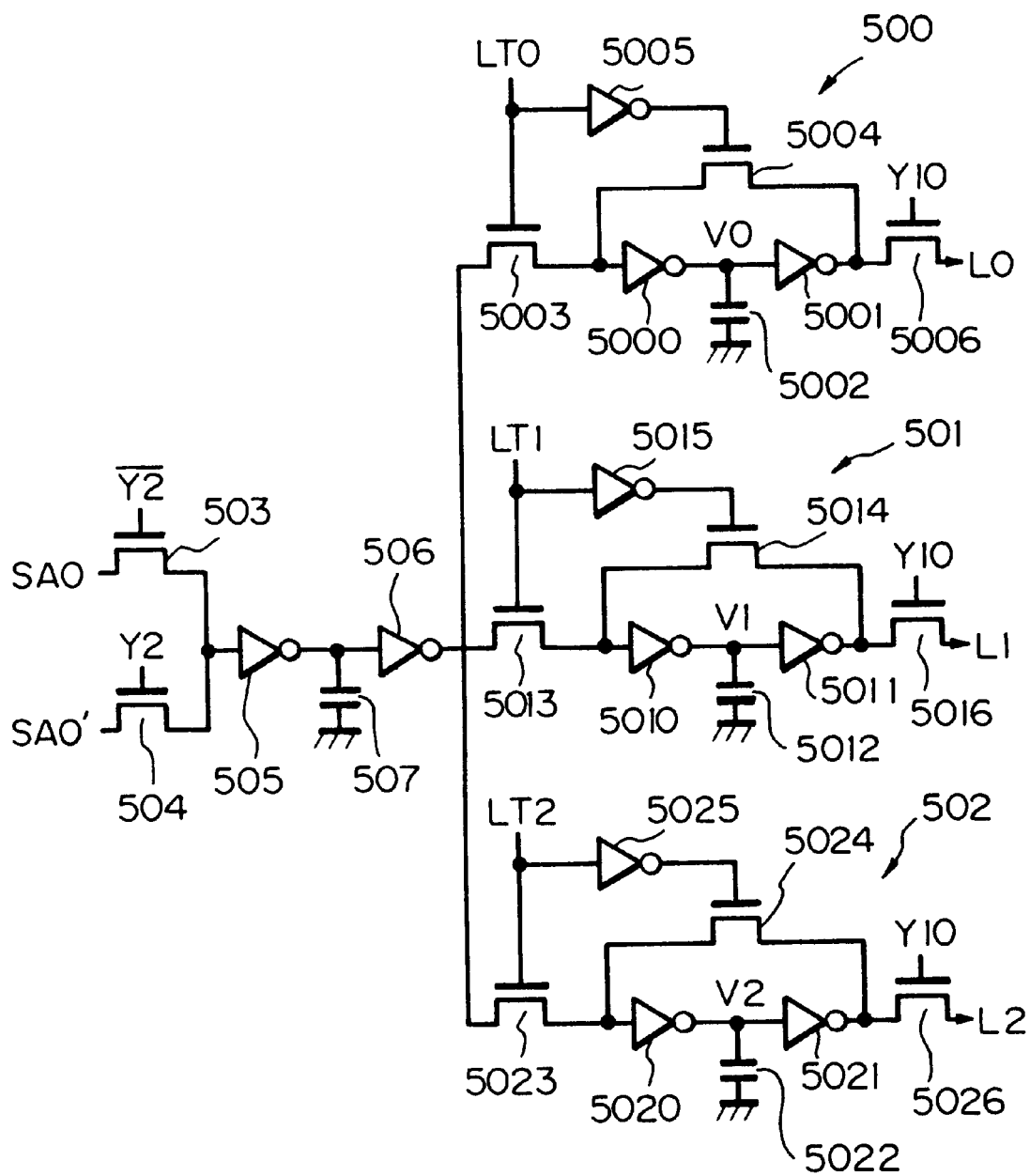
FIG. 6 is a circuit diagram of the latch circuit of FIG. 5.

FIG. 6 is a detailed circuit diagram of the latch circuit 50' FIG. 5. Note that the latch circuits 51', 52' and 53' have the same configuration as the latch circuit 50'. As illustrated in FIG. 6, the latch circuit 50' includes switches 503 and 504, inverters 505 and 506, and a capacitor 507 in addition to the latch circuit 50 of FIG. 2. The switches 503 and 504 are controlled by the Y switch signals $\overline{Y2}$ and Y2, respectively. That is, when $\overline{Y2}$="1", the output signal SA0 of the sense amplifier 40 of the sense amplifier 4-1 is supplied to one of the latch elements 500, 501 and 502. On the other hand, when Y2="1", the output signal SA0' of the sense amplifier 40' (not shown) of the sense amplifier 4-2 is supplied to one of the latch elements 500, 501 and 503.

Figure 7:
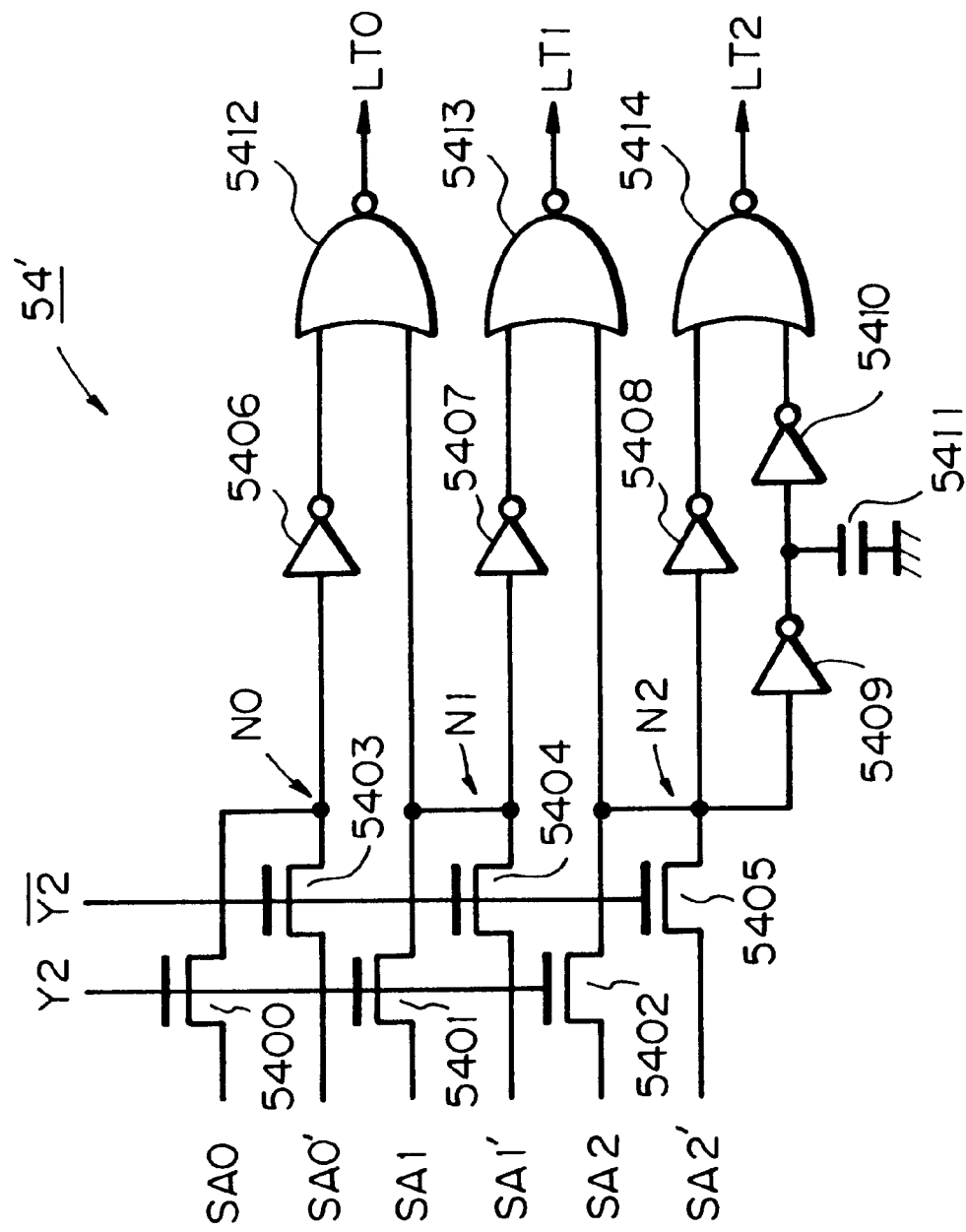
FIG. 7 is a detailed circuit diagram of the latch timing generating circuit of FIG. 5.

In FIG. 7, which is a detailed circuit diagram of the latch timing generating circuit 54' of FIG. 5, the latch timing generating circuit 54' is constructed by switches 5400, 5401 and 5402 controlled by the Y switch signal Y2, switches 5403, 5404 and 5405 controlled by the Y switch signal $\overline{Y2}$, inverters 5406, 5407, 5408, 5409 and 5410, a capacitor 5411, and NOR circuits 5412, 5413 and 5414. That is, when Y2="1", the output signals SA0, SA1 and SA2 of the sense amplifiers 40, 41 and 42 are transmitted via the switches 5400, 5401 and 5402 to nodes N0, N1 and N2. On the other hand, when $\overline{Y2}$="1", the output signals SA0', SA1' and SA2' of the sense amplifiers 40', 41' and 42' (not shown) are transmitted via the switches 5403, 5404 and 5405 to the nodes N0, N1 and N2.

Only when the voltage at the node N0 is low and the voltage at the node N1 is high, is the output signal of the NOR circuit 5412 high. Similarly, only when the voltage at the node N1 is low and the voltage at the node N2 is high, is the output signal of the NOR circuit 5413 high. On the other hand, for a definite time period after the voltage at the node N2 becomes high, the output signal of the NOR circuit 5414 is high. In this case, this definite time period is determined by a difference between a delay time of the inverter 5408 and a delay time of a delay circuit formed by the inverters 5409 and 5410 and the capacitor 5411.

Figures 8A, 8B:
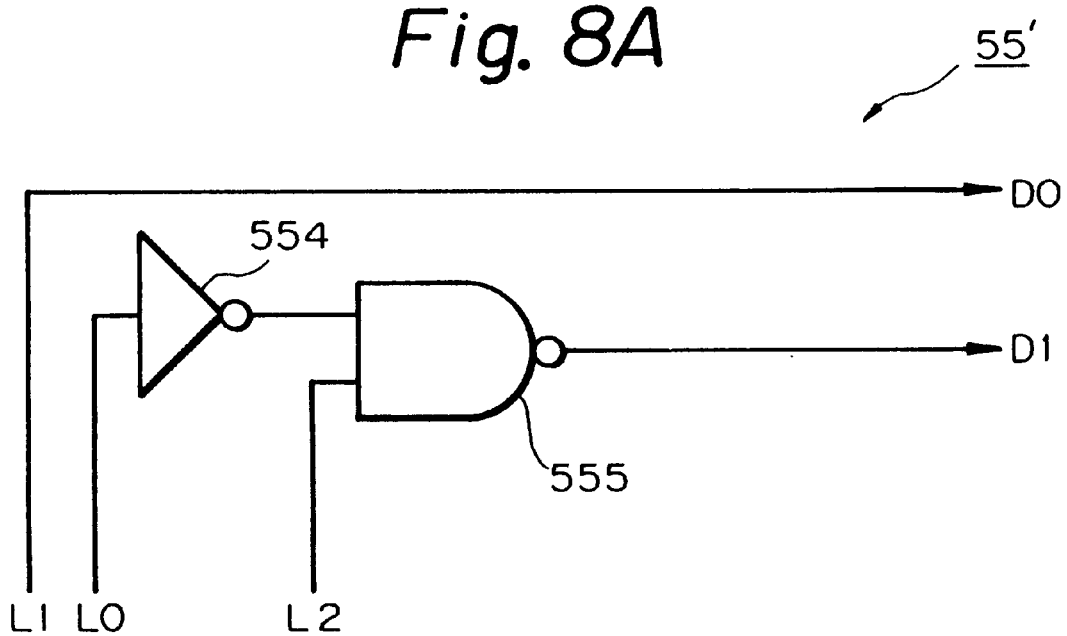
FIG. 8A is a detailed circuit diagram of the encoder circuit of FIG. .5.
FIG. 8B is a table showing the input and output relationship of the encoder circuit of FIG. 8A.

In FIG. 8A, which is a detailed circuit diagram of the encoder circuit 55' of FIG. 5, the signal L1 is output directly as the output data D0. Also, the encoder circuit 55' is constructed by an inverter 554 for receiving the signal L0, and a NAND circuit 555 for receiving an output signal of the inverter 554 and the signal L2. The input and output relationship of the encoder circuit 55' of FIG. 8A is shown in FIG. 8B.

Figures 9, 10A, 10B, 10C:
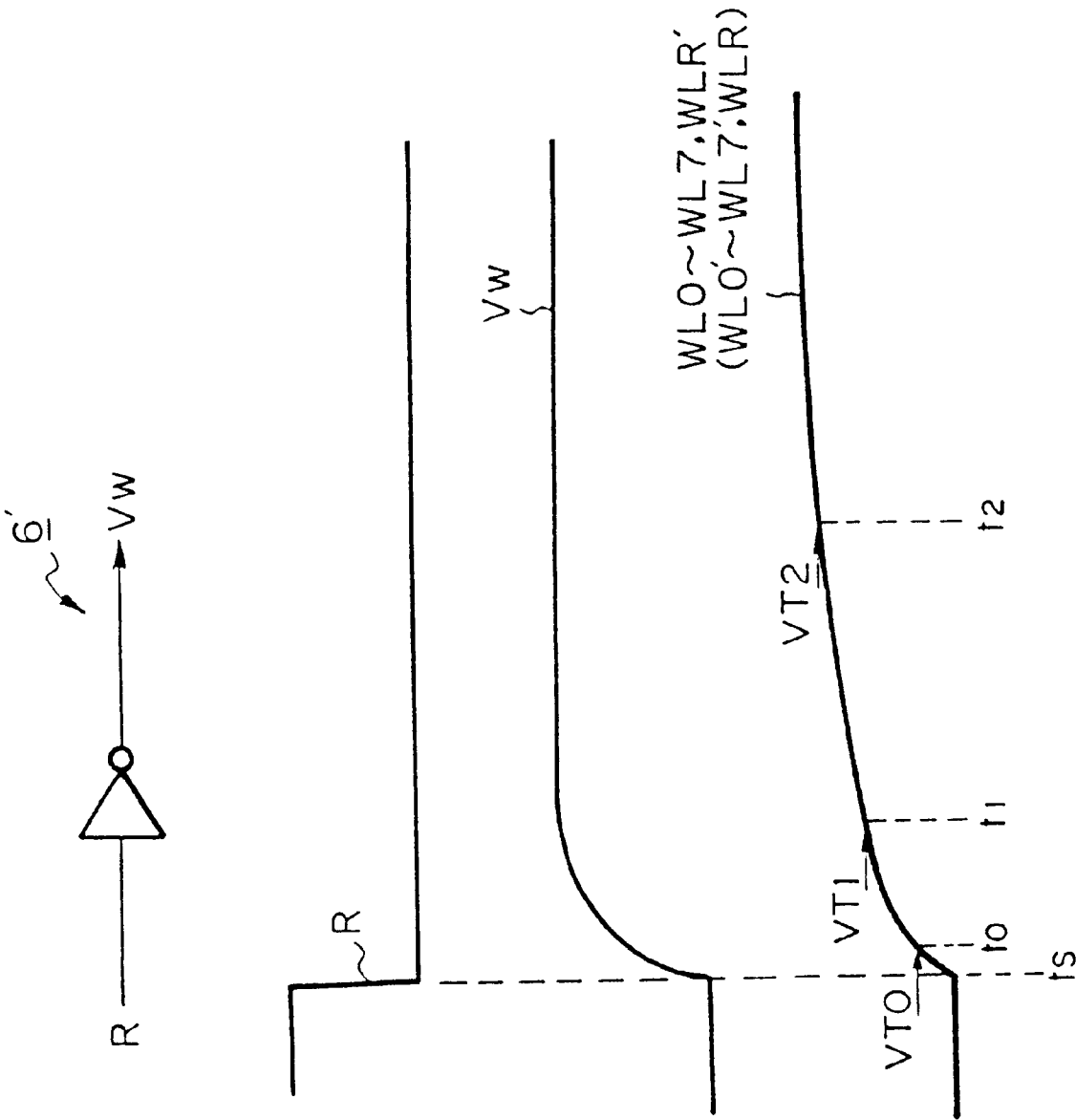
FIG. 9 is a circuit diagram of the voltage generating circuit of FIG. 5.
FIGS. 10A, 10B and 10C are timing diagrams showing the operation of the voltage generating circuit of FIG. 9.

In FIG. 9, which is a detailed circuit diagram of the voltage generating circuit 6' of FIG. 5, the voltage generating circuit 6' formed by an inverter for receiving a read operation signal R from a control circuit (not shown). As a result, after the read operation signal R is started at time $t_S$ as shown in FIG. 10A, the voltage $V_W$ is relatively-rapidly increased in accordance with a time constant determined by the inverter of FIG. 9, as shown in FIG. 10B. Further, as shown in FIG. 10C, since one of the word lines WL0 to WL7 (WL0' to WL7') and the reference word line $WLR^2$ (WLR) have a relatively large time constant due to the resistance and capacitance thereof, the voltage at one of the word lines and one of the reference word lines one gradually increased in accordance with this large time constant. For example, at time t0, the voltages at one of the word lines and one of the reference word lines reaches VT0, at time t1, they reaches VT1, and at time t2, it reaches VT2.

The operation of the device of FIG. 5 is explained next with reference to FIGS. 11A through 11L. Here, as shown in FIG. 11A, assume that Y2="1", so that one of the word lines of the memory cell array 1'-1 such as WL0 is selected in accordance with the X address signals X0, X1 and X2, and the reference word line WLR' of the memory cell array 1'-2 is selected. Also, in this case, the output signals SA0, SA1, SA2 and SA3 are latched in the latch circuits 50', 51', 52' and 53', while the output signals SA0', SA1' and SA2' are substantially input to the latch timing generating circuit 54'.

As shown in FIG. 11B, the voltage at the word line WL0 and the voltage at the reference word line WLR' are gradually increased simultaneously.

As shown in FIG. 11C, since the reference memory cell RC0' (not shown) has the threshold voltage VT0, the output signal SA0' of the sense amplifier 40' (not shown) connected to the reference memory cell RC0' becomes high after the voltage at the reference word line WLR' reaches VT0 at time t0.

Also, as shown in FIG. 11D, since the reference memory cell RC1' (not shown) has the threshold voltage VT1, the output signal SA1' of the sense amplifier 41' (not shown) connected to the reference memory cell RC1' becomes high after the voltage at the reference word line WLR' reaches VT1 at time t1.

Further, as shown in FIG. 11E, since the reference memory cell RC2' (not shown) has the threshold voltage VT2, the output signal SA2' of the sense amplifier 42' (not shown) connected to the reference memory cell RC2' becomes high after the voltage at the reference word line WLR' reaches VT2 at time t2.

As stated above, the output signals SA0', SA1' and SA2' of the sense amplifiers of the sense amplifier circuit 4-2 are selected and input to the latch timing generating circuit 51'. Therefore, only when SA0'="1" and SA1'="0", is the latch timing signal LT0 high as shown in FIG. 11F. Also, only when SA1'="1" and SA2'="0", is the latch timing signal LT1 high as shown in FIG. 11G. Further, after the output signal SA2' of the sense amplifier 43' (not shown) becomes high, the latch timing signal LT2 is high for a definite time period as shown in FIG. 11H.

On the other hand, as shown in FIG. 11I, if the selected memory cell such as $C_{00}$ has the threshold voltage VT0, the output signal SA0 of the sense amplifier 40 connected to the selected memory cell $C_{00}$ becomes high after the voltage at the word line WL0 reaches VT0 at time t0. Therefore, in this case, the signals L0, L1 and L2 of the latch circuit 50' are "1", "1" and "1", respectively.

As shown in FIG. 11J, if the selected memory cell $C_{00}$ has the threshold voltage VT1, the output signal SA0 of the sense amplifier 40 connected to the selected memory cell $C_{00}$ becomes high after the voltage at the word line WL0 reaches VT1 at time t1. Therefore, in this case, the signals L0, L1 and L2 of the latch circuit 50' are "0", "1" and "1", respectively.

As shown in FIG. 11K, if the selected memory cell $C_{00}$ has the threshold voltage VT2, the output signal SA0 of the sense amplifier 40 connected to the selected memory cell Coo becomes high after the voltage at the word line WL0 reaches VT2 at time t2. Therefore, in this case, the signals L0, L1 and L2 of the latch circuit 50' are "0", "0" and "1", respectively.

As shown in FIG. 11L, if the selected memory cell $C_{00}$ has the threshold voltage VT3, the output signal SA0 of the sense amplifier 40 connected to the selected memory cell $C_{00}$ never becomes high. Therefore, in this case, the signals L0, L1 and L2 of the latch circuit 50' are "0", "0" and "0", respectively.

Thus, with the relationship as shown in FIG. 8B, the threshold voltages VT0, VT1, VT2 and VT3 and the output signals D0 and D1 of the encoder circuit 55' have the relationship as shown in FIG. 12.

Figure 13:
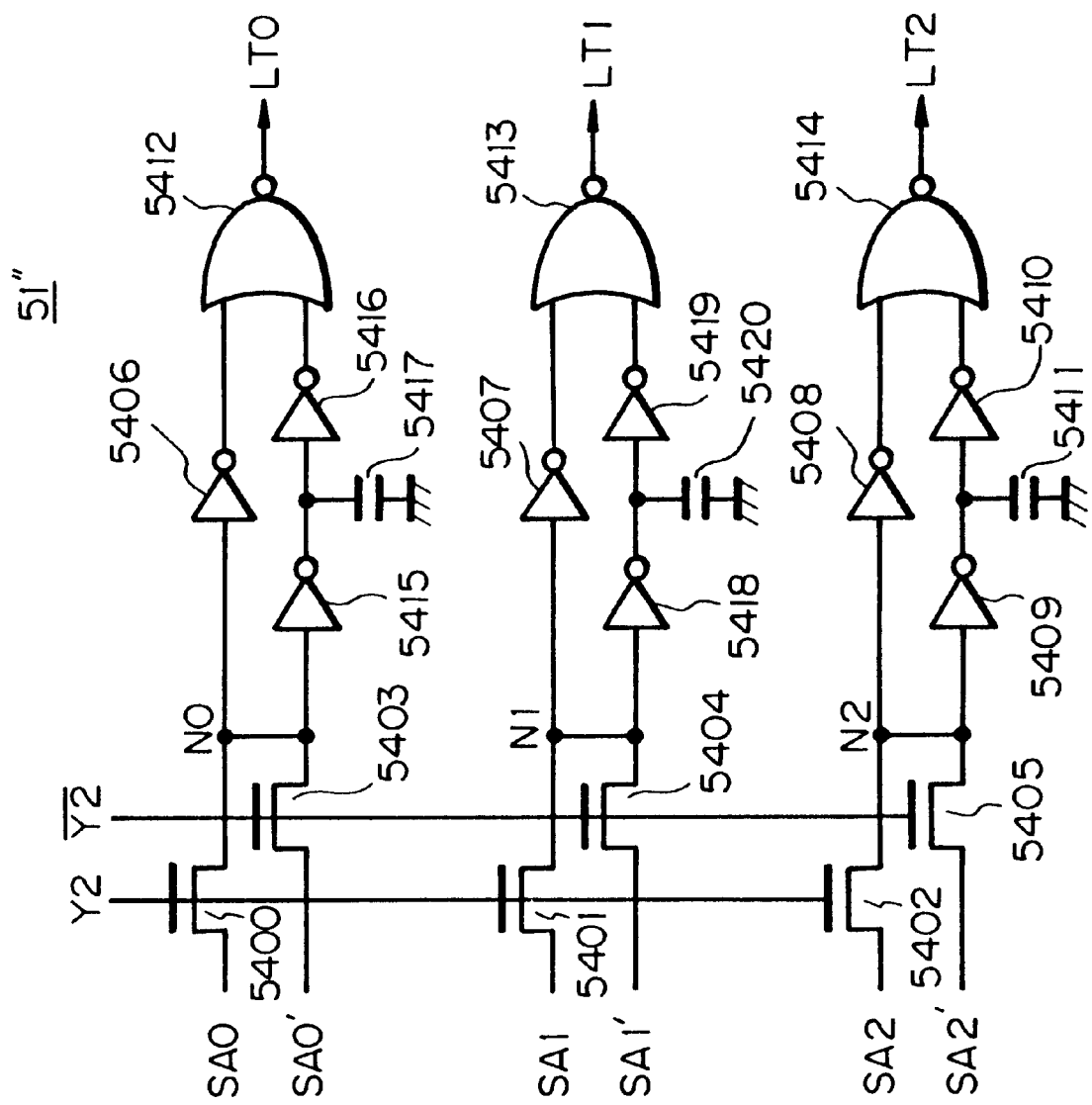
FIG. 13 is a circuit diagram illustrating a modification of the latch timing generating circuit of FIG. 7.

In FIG. 13, which illustrates a modification of the latch timing generating circuit 51' of FIG. 7, a latch timing generating circuit 51" includes a delay circuit formed by inverters 5415, 5417 and a capacitor 5416, and a delay circuit formed by inverters 5418, 5419 and a capacitor 5420 in addition to the elements of the latch timing circuit 51' of FIG. 7. In addition, the NOR circuit 5412 receives only the output signal SA0 (SA0'), and the NOR circuit 5413 receives only the output signal SA1 (SA1'). In other words, the generation of the latch timing signals LT0 and LT1 is similar to that of the latch timing signal LT2. Therefore, for a definite time period after the voltage at the node N0 becomes high, the output signal of the NOR circuit 5412 is high. In this case, this definite time period is determined by a difference between a delay time of the inverter 5406 and a delay time of the delay circuit formed by the inverters 5415 and 5416 and the capacitor 5417. Also, for a definite time period after the voltage at the node N2 becomes high, the output signal of the NOR circuit 5413 is high. In this case, this definite time period is determined by a difference between a delay time of the inverter 5407 and a delay time of the delay circuit formed by the inverters 5418 and 5419 and the capacitor 5420.

The operation of the device of FIG. 5 where the latch timing generating circuit 51" of FIG. 13 is used instead of the latch timing generating circuit 51' of FIG. 7 is illustrated in FIGS. 14A through 14L. As shown in FIGS. 14F, 14G and 14H, the latch timing signals LT0, LT1 and LT2 have definite time periods $T_1$, $T_2$ and $T_3$. In this case, the definite time periods $T_1$, $T_2$, and $T_3$ are so adjusted by the capacitors 5417, 5420 and 5411 or the like, so that the definite time periods $T_1$, $T_2$, and $T_3$ are not superimposed onto each other.

Figure 15B:
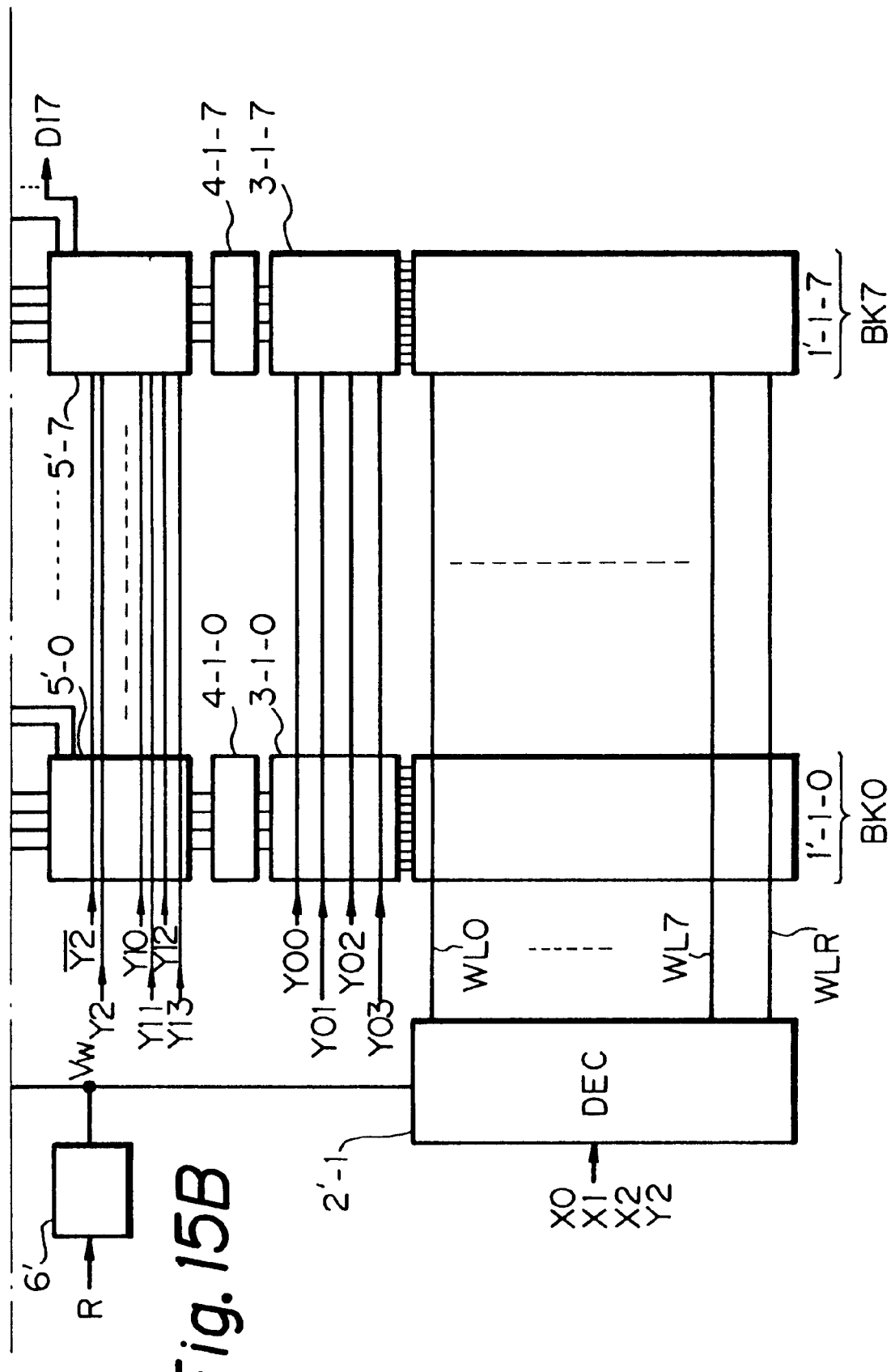

In FIG. 15, which illustrates a second embodiment of the present invention, the ROM device of FIG. 5 is extended to a 16-bit ROM device. That is, eight memory cell arrays 1'-1-0 to 1'-1-7 corresponding to the memory cell array 1'-1 of FIG. 5, eight memory cell arrays 1'-2-0 to 1'-2-7 corresponding to the memory cell array 1'-2 of FIG. 5, eight Y selector circuits 3-1-0 to 3-1-7 corresponding to the Y selector circuit 3-1 of FIG. 5, eight Y selector circuits 3-2-0 to 3-2-7 corresponding to the Y selector circuit 3-2 of FIG. 5, eight sense amplifier circuits 4-1-0 to 4-1-7 corresponding to the sense amplifier circuit 4-1 of FIG. 5, eight sense amplifier circuits 4-2-0 to 4-2-7 corresponding to the sense amplifier circuit 4-2 of FIG. 5, and eight determination circuits 5'-0 to 5'-7 corresponding to the determination circuit 5'of FIG. 5 are provided. In this case, the row decoders 2'-1 and 2'-2 and the voltage generating circuit 6' and the Y switch signals of FIG. 5 are provided in common for eight blocks BK0 to BK7. Thus, 16-bit output data D00 to D07 and D10 to D17 are simultaneously read.

The present invention can be applied to multivalued ROM devices other than a four-valued ROM device.

As explained hereinabove, according to the present invention, since a read operation is completed by only increasing the voltages at a selected word line and reference word line, the read operation speed can be increased. For example, in the prior art device, it takes 200 ns×3 =600 ns for one read operation, while, in the present invention, it takes 200 ns for one read operation.

Also, according to the present invention, if only the timings of the ON- and OFF-operation of the sense amplifiers as indicated by times t0, t1 and t2 of FIGS. 11A through 11L are satisfied, it is possible to increase the difference ΔV between the gate voltage and the threshold voltage of a selected memory cell. Therefore, high sensitivity sense amplifiers are not necessary, so that the device is not subjected to noise. Also, the sense amplifiers can be simplified.

Further, according to the present invention, since the encoder circuit can be simplified in addition to the simplification of the sense amplifiers, and the voltage generating circuit for the voltage at the word lines can be simplified, the integration of the device can be enhanced.

Moreover, since the deviation of threshold voltages written into the memory cells is almost the same as the deviation of threshold voltages written into the reference memory cells, the affect of deviation of threshold voltages can be diminished.

I claim:

1. A multivalued read only memory device comprising:
   a plurality of word lines;
   a plurality of memory cells, connected to said word lines, each for storing N (N=3, 4, . . . ) information states corresponding to N threshold voltages;
   a reference word line;
   a plurality of reference memory cells, connected to said reference word line, for storing said N information states;
   a word line selecting circuit, connected to said word lines and said reference word line, for selecting one of said word lines and selecting said reference word line;
   a voltage generating circuit, connected to said word line selecting circuit, for gradually increasing a voltage at a selected one of said word lines and a voltage at said reference word line;

a first sense amplifier circuit, connected to said memory cells, for amplifying a voltage of a selected one of said memory cells;

a second sense amplifier circuit, connected to said reference memory cells, for amplifying voltages of said reference memory cells;

a latch timing generating circuit, connected to said second sense amplifier circuit, for generating latch timing signals in accordance with output signals of said second sense amplifier circuit;

a latch circuit, connected to said latch timing generating circuit and said first sense amplifier circuit, for latching an output signal of said first sense amplifier circuit in accordance with said latch timing signals; and an encoder circuit, connected to said latch circuit, for generating output data in accordance with output signals of said latch circuit.

2. The device as set forth in claim 1, wherein said voltage generating circuit comprises a RC delay circuit.

3. A multivalued read only memory device comprising:

a plurality of first word lines;

a first reference word line;

a first memory cell array including a first plurality of memory cells, connected to said word lines, each for storing N (N=3, 4, . . . ) information states corresponding to N threshold voltages, and a plurality of first reference memory cells, connected to said first reference word line, for storing said N information states;

a plurality of second word lines;

a second reference word line;

a second memory cell array including a second plurality of memory cells, connected to said word lines, each for storing N information states corresponding to N threshold voltages, and a plurality of second reference memory cells, connected to said second reference word line, for storing said N information states;

a first word line selecting circuit connected to said first word lines and said first reference word line;

a second word line selecting circuit connected to said second word lines and said second reference word line;

a voltage generating circuit, connected to said first and second word line selecting circuit, for gradually increasing voltages at a selected one of said first and second word lines and a voltage at a selected one of said first and second reference word lines;

a first sense amplifier circuit, connected to said first memory cell array, for amplifying voltages of selected ones of said first memory cells and said first reference memory cells;

a second sense amplifier circuit, connected to said second memory cell array, for amplifying voltages of selected ones of said second memory cells and said second reference memory cells;

a latch timing generating circuit, connected to said first and second sense amplifier circuits, for generating latch timing signals in accordance with output signals of one of said first and second sense amplifier circuits;

a latch circuit, connected to said latch timing generating circuit and said first and second sense amplifier circuits, for latching an output signal of one of said first and second sense amplifier circuits in accordance with said latch timing signals; and an encoder circuit, connected to said latch circuit, for generating output data in accordance with output signals of said latch circuit.

4. The device as set forth in claim 3, wherein a control signal is supplied to said first and second word line selecting circuits, said latch timing generating circuit and said latch circuit, when said control signal is in a first state, said first word line selecting circuit selecting one of said first word lines, said second word line selecting circuit selecting said second reference word line, said latch timing generating circuit generating said latch timing signals in accordance with the output signals of said second sense amplifier circuit, and said latch circuit latching the output signals of said first sense amplifier circuit, when said control signal is in a second state, said first word line selecting circuit selecting said first reference word line, said second word line selecting circuit selecting one of said second word lines, said latch timing generating circuit generating said latch timing signals in accordance with the output signals of said first sense amplifier circuit, and said latch circuit latching the output signals of said second sense amplifier circuit.

5. The device as set forth in claim 3, wherein said voltage generating circuit comprises a RC delay circuit.

6. The device as set forth in claim 4, wherein said latch timing generating circuit comprises:

a plurality of transfer gate circuits, connected to said first and second sense amplifier circuits, for passing the output signals of said second sense amplifier circuit when said control signal is in said first state and passing the output signals of said first sense amplifier circuit when said control signal is in said second state;

a plurality of first logic circuits, each connected to two of said transfer gate circuits and generating one of said latch timing signals when output signals of the two of said transfer gate circuits are different from each other; and a second logic circuit, connected to one of said transfer gate circuits, for generating one of said latch timing signals when an output of the one of said transfer gate circuits is changed.

7. The device as set forth in claim 4, wherein said latch timing generating circuit comprises:

a plurality of transfer gate circuits, connected to said first and second sense amplifier circuits, for passing the output signals of said second sense amplifier circuit when said control signal is in said first state and passing the output signals of said first sense amplifier circuit when said control signal is in said second state; and a plurality of logic circuits, each connected to one of said transfer gate circuits and generating one of said latch timing signals when an output of the one of said transfer gate circuits is changed.

8. The device as set forth in claim 4, wherein said latch circuit comprises:

a transfer gate circuit, connected to said first and second sense amplifier circuits, for passing the output signals of said first sense amplifier circuit when said control signal is in said first state and passing the output signals of said second sense amplifier circuit when said control signal is in said second state; and a plurality of latch elements, connected to said transfer gate circuit, for latching an output signal of said transfer gate circuit in response to said latch timing signals.

9. A four-valued read only memory device comprising:

a plurality of first word lines;

a first reference word line;

a first memory cell array including a first plurality of memory cells, connected to said word lines, each for storing four information states corresponding to four threshold voltages, and a plurality of first reference memory cells, connected to said first reference word line, for storing said four information states;

a plurality of second word lines;

a second reference word line;

a second memory cell array including a second plurality of memory cells, connected to said word lines, each for storing four information states corresponding to four threshold voltages, and a plurality of second reference memory cells, connected to said second reference word line, for storing said four information states;

a first word line selecting circuit connected to said first word lines and said first reference word line;

a second word line selecting circuit connected to said second word lines and said second reference word line;

a voltage generating circuit, connected to said first and second word line selecting circuit, for gradually increasing voltages at a selected one of said first and second word lines and a voltage at a selected one of said first and second reference word lines;

a first sense amplifier circuit, connected to said first memory cell array, for amplifying voltages of selected ones of said first memory cells and said first reference memory cells;

a second sense amplifier circuit, connected to said second memory cell array, for amplifying voltages of selected ones of said second memory cells and said second reference memory cells;

a latch timing generating circuit, connected to said first and second sense amplifier circuits, for generating first, second and third latch timing signals in accordance with output signals of one of said first and second sense amplifier circuits;

a latch circuit, connected to said latch timing generating circuit and said first and second sense amplifier circuits, for latching an output signal of one of said first and second sense amplifier circuits in accordance with said first, second and third latch timing signals; and an encoder circuit, connected to said latch circuit, for generating output data in accordance with output signals of said latch circuit.

10. The device as set forth in claim 9, wherein a control signal is supplied to said first and second word line selecting circuits, said latch timing generating circuit and said latch circuit, when said control signal is in a first state, said first word line selecting circuit selecting one of said first word lines, said second word line selecting circuit selecting said second reference word line, said latch timing generating circuit generating said first, second and third latch timing signals in accordance with the output signals of said second sense amplifier circuit, and said latch circuit latching the output signals of said first sense amplifier circuit, when said control signal is in a second state, said first word line selecting circuit selecting said first reference word line, said second word line selecting circuit selecting one of said second word lines, said latch timing generating circuit generating said first, second and third latch timing signals in accordance with the output signals of said first sense amplifier circuit, and said latch circuit latching the output signals of said second sense amplifier circuit.

11. The device as set forth in claim 9, wherein said voltage generating circuit comprises a RC delay circuit.

12. The device as set forth in claim 10, wherein said latch timing generating circuit comprises:

first, second and third transfer gate circuits, connected to said first and second sense amplifier circuits, for passing the output signals of said second sense amplifier circuit when said control signal is in said first state and passing the output signals of said first sense amplifier circuit when said control signal is in said second state;

a first logic circuit connected to said first and second transfer gate circuits and generating said first latch timing signal when output signals of said first and second transfer gate circuits are different from each other;

a second logic circuit connected to said second and third transfer gate circuits and generating said second latch timing signal when output signals of said second and third transfer gate circuits are different from each other; and a third logic circuit, connected to said third transfer gate circuit, for generating said third latch timing signal when an output of said third transfer gate circuit is changed.

13. The device as set forth in claim 10, wherein said latch timing generating circuit comprises:

three transfer gate circuits, connected to said first and second sense amplifier circuits, for passing the output signals of said second sense amplifier circuit when said control signal is in said first state and passing the output signals of said first sense amplifier circuit when said control signal is in said second state; and three logic circuits, each connected to one of said transfer gate circuits and generating one of said first, second and third latch timing signals when an output of the one of said first, second and third transfer gate circuits is changed.

14. The device as set forth in claim 10, wherein said latch circuit comprises:

a transfer gate circuit, connected to said first and second sense amplifier circuits, for passing the output signals of said first sense amplifier circuit when said control signal is in said first state and passing the output signals of said second sense amplifier circuit when said control signal is in said second state; and first, second and third latch elements, connected to said transfer gate circuit, for latching an output signal of said transfer gate circuit in response to said first, second and third latch timing signals, respectively.

15. The device as set forth in claim 14, wherein said encoder circuit comprises:

a first data output terminal connected to said second latch element;

a second data output terminal;

an inverter connected to said first latch element; and a NAND circuit having inputs connected to said inverter and said third latch element and an output connected to said second data output terminal.

* * * * *